(12) United States Patent
Kim et al.

(10) Patent No.: US 9,966,936 B2
(45) Date of Patent: May 8, 2018

(54) SEMICONDUCTOR INTEGRATED CIRCUITS

(71) Applicants: Ji-Kyum Kim, Gyeonggi-do (KR); Dae-Seong Lee, Busan (KR); Min-Su Kim, Hwaseong-si (KR)

(72) Inventors: Ji-Kyum Kim, Gyeonggi-do (KR); Dae-Seong Lee, Busan (KR); Min-Su Kim, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days. days.

(21) Appl. No.: 15/172,182

(22) Filed: Jun. 3, 2016

(65) Prior Publication Data
US 2017/0077910 A1   Mar. 16, 2017

(30) Foreign Application Priority Data
Sep. 10, 2015 (KR) .................. 10-2015-0128529

(51) Int. Cl.
*H03K 3/356* (2006.01)
*H03K 3/3562* (2006.01)
*G01R 31/3185* (2006.01)

(52) U.S. Cl.
CPC . *H03K 3/35625* (2013.01); *G01R 31/318541* (2013.01)

(58) Field of Classification Search
CPC ................... H03K 3/35625; G01R 31/318541
USPC .............. 327/199–226, 403, 404, 564–566
See application file for complete search history.

(56) References Cited

U.S. PATENT DOCUMENTS

| | | | |
|---|---|---|---|
| 7,861,202 B2 | 12/2010 | Sumita | |
| 8,274,319 B2 | 9/2012 | Maeno | |
| 8,468,485 B2 | 6/2013 | Ushiyama | |
| 8,723,574 B2 | 5/2014 | Tomita | |
| 8,856,704 B2 | 10/2014 | Baeg | |
| 8,984,463 B2 | 3/2015 | Xie et al. | |
| 2011/0032016 A1* | 2/2011 | Maeno | H03K 3/356156 327/203 |
| 2011/0302540 A1 | 12/2011 | Kwon et al. | |

FOREIGN PATENT DOCUMENTS

| | | |
|---|---|---|
| JP | 2005268278 A | 9/2005 |
| JP | 2010141047 B | 6/2010 |
| JP | 20120110470 A | 10/2012 |
| JP | 2013207771 A | 10/2013 |

* cited by examiner

*Primary Examiner* — Thomas Skibinski
(74) *Attorney, Agent, or Firm* — Volentine, Whitt & Francos, PLLC

(57) ABSTRACT

A semiconductor integrated circuit includes a scan enable (SE) inverter and a clock (CK) inverter on a substrate, a first multiplex part, and a second multiplex part. The SE inverter and the CK inverter are aligned in a first direction. The first multiplex part includes a first wiring and a first transistor, the first wiring is connected to a power supply voltage part of the SE inverter, and the first wiring and the first transistor share a source region contacting the first wiring. The second multiplex part includes a second wiring and a second transistor, the second wiring is connected to a power supply voltage part of the CK inverter, and the second wiring and the second transistor share a source region contacting the second wiring. The SE inverter and the CK inverter are aligned in a first direction to each other.

18 Claims, 13 Drawing Sheets

SEMICONDUCTOR INTEGRATED CIRCUITS

CROSS-REFERENCE TO RELATED APPLICATION

This application claims priority under 35 USC § 119 to Korean Patent Application No. 10-2015-0128529, filed on Sep. 10, 2015 in the Korean Intellectual Property Office (KIPO), the contents of which are herein incorporated by reference in their entirety.

BACKGROUND

1. Field

Example embodiments relate to a semiconductor integrated circuit. More particularly, example embodiments relate to a semiconductor integrated circuit having a flip-flop circuit.

2. Description of the Related Art

As a capacity of a semiconductor device increases, a test time of the semiconductor device may increase. A scan test or a daisy chain test may be used as the test of the semiconductor device, and a plurality of unit flip-flop circuits may be formed in the semiconductor device. In order to achieve a high degree of integration of the semiconductor device, forming the unit flip-flop circuits in a small horizontal area is needed.

SUMMARY

Example embodiments provide a semiconductor integrated circuit including unit flip-flop circuits formed in a small horizontal area.

According to example embodiments, there is provided a semiconductor integrated circuit. The semiconductor integrated circuit may include a scan enable (SE) inverter and a clock (CK) inverter on a substrate, a first multiplex part and a second multiplex part. The SE inverter and the CK inverter may be aligned in a first direction to each other. The first multiplex part may include a first wiring and a first transistor, the first wiring may be connected to a power supply voltage part of the SE inverter, and the first wiring and the first transistor may share a source region contacting the first wiring. The second multiplex part may include a second wiring and a second transistor, the second wiring may be connected to a power supply voltage part of the CK inverter, and the second wiring and the second transistor may share a source region contacting the second wiring.

In example embodiments, the CK inverter may be disposed under the SE inverter in the first direction.

In example embodiments, the CK inverter may be disposed over the SE inverter in the first direction.

In example embodiments, the power supply voltage parts of the SE inverter and the CK inverter may include a first VDD line and a second VDD line, respectively, each of the first and second VDD lines may extend in a second direction substantially perpendicular to the first direction. The first wiring may be connected with the first VDD line, and the second wiring may be connected with the second VDD line.

In example embodiments, the semiconductor integrated circuit may further include a ground line extending in the second direction. The SE inverter and the CK inverter may be connected with the ground line.

In example embodiments, the power supply voltage parts of the SE inverter and the CK inverter may include a VDD extending in the second direction, and the first and second wirings may be connected with the VDD line.

In example embodiments, the semiconductor integrated circuit may further include a first ground line and a second ground line each extending in the second direction. The SE inverter may be connected with the first ground line, and the CK inverter may be connected with the second ground line.

In example embodiments, the CK inverter and the SE inverter may be formed in areas of the substrate, the areas having substantially the same size.

In example embodiments, a first gate of the SE inverter and a second gate of the CK inverter may be aligned in the first direction.

In example embodiments, the semiconductor integrated circuit may further include a first master part, a first slave part and a first output part disposed adjacent to the first multiplex part in this order in the second direction. Also, the semiconductor integrated circuit may further include a second master part, a second slave part and a second output part disposed adjacent to the second multiplex part in this order in the second direction.

In example embodiments, the first master part, the first slave part and the first output part may be aligned in the first direction to the second master part, the second slave part and the second output part, respectively.

According to example embodiments, there is provided a semiconductor integrated circuit. The semiconductor integrated circuit may include a substrate, a scan enable (SE) inverter and a clock (CK) inverter, a first multiplex part and a second multiplex part. The substrate may include a first region for processing a first bit and a second region for processing a second bit. The second region may be under the first region in a first direction. The SE inverter and the CK inverter may be formed on the substrate. The SE inverter and the CK inverter may be aligned to each other in the first direction. The first multiplex part may be adjacent to the SE inverter in a second direction substantially perpendicular to the first direction. The first multiplex part may include a first wiring and a first transistor. The first wiring may be connected to a power supply voltage of the SE inverter, and the first wiring and the first transistor may share an impurity region contacting the first wiring. The second multiplex part including a second wiring and a second transistor, the second wiring being connected to a power supply voltage of the CK inverter, and the second wiring and the second transistor sharing an impurity region contacting the second wiring.

In example embodiments, the SE inverter may be formed in the first region, and the CK inverter may be formed in the second region.

In example embodiments, the CK inverter may be formed in the first region, and the SE inverter may be formed in the second region.

In example embodiments, the semiconductor integrated circuit may further include a first VDD line, a second VDD line and a ground line each extending in the second direction. The first VDD line may be formed at an upper portion of the first region, the second VDD line may be formed at a lower portion of the second region. The ground line may be formed between the first and second regions.

In example embodiments, the first wiring may be connected to one of the first VDD line and the second VDD line adjacent to the first wiring. The second wiring may be connected to another one of the first VDD line and the second VDD line.

In example embodiments, the semiconductor integrated circuit may further include a first ground line, a second ground line and a VDD line each extending in the second direction. The first ground line may be formed at an upper portion of the first region. The second ground line may be formed at a lower portion of the second region. The VDD line may be formed between the first and second regions.

In example embodiments, the first and second wirings may be connected to the VDD line.

In example embodiments, the SE inverter may include a first gate extending in the first direction on first and second active regions. The first and second active regions may be substantially parallel with each other. The CK inverter may include a second gate extending in the first direction on third and fourth active regions. The third and fourth active regions may be substantially parallel with each other.

In example embodiments, the first and second gates may be aligned to each other in the first direction.

In example embodiments, a transistor of the first multiplex part adjacent to the SE inverter may include a third gate extending in the first direction on the first and second active regions. The third gate may be adjacent to the first gate in the second direction, and the first wiring may be formed between the first and third gates.

In example embodiments, the SE inverter may be formed within an area of equal to or less than about 1.5 times of a first width, the first width may be a distance between a central portion of the first gate and a central portion of the third gate in the second direction.

In example embodiments, a transistor of the second multiplex part may include a fourth gate extending in the first direction on the third and fourth active regions. The fourth gate may be adjacent to the second gate in the second direction, and the second wiring may be formed between the second and fourth gates.

In example embodiments, the third and fourth gates may be aligned to each other in the first direction In example embodiments, the CK inverter and the SE inverter may be formed in areas of the substrate, the areas having substantially the same size.

In example embodiments, the semiconductor integrated circuit may further include a first master part, a first slave part and a first output part being disposed adjacent to the first multiplex part in this order in the second direction. The semiconductor integrated circuit may further include a second master part, a second slave part and a second output part being disposed adjacent to the second multiplex part in this order in the second direction.

In example embodiments, the first master part, the first slave part and the first output part may be aligned in the first direction with the second master part, the second slave part and the second output part, respectively.

According to example embodiments, there is provided a semiconductor integrated circuit. The semiconductor integrated circuit may include a scan enable (SE) inverter, a clock (CK) inverter, a first bit circuit, and a second bit circuit. The SE inverter may be formed on a first region of a substrate. The CK inverter may be formed on a second region of the substrate. The CK inverter and the SE inverter may be aligned to each other in a first direction. The first bit circuit may be formed on the first region. The first bit circuit may include a first multiplex part, a first master part, a first slave part and a first output part being disposed adjacent to the SE inverter in this order in a second direction substantially perpendicular to the first direction. The second bit circuit may be formed on the second region. The second bit circuit may include a second multiplex part, a second master part, a second slave part and a second output part being disposed adjacent to the CK inverter in this order in the second direction.

In example embodiments, the first multiplex part may include a first wiring and a first transistor. The first wiring may be connected to a power supply voltage of the SE inverter, and the first wiring and the first transistor may share a source region contacting the first wiring.

In example embodiments, the second multiplex part may include a second wiring and a second transistor. The second wiring may be connected to a power supply voltage part of the CK inverter, and the second wiring and the second transistor may share a source region contacting the second wiring.

In example embodiments, the semiconductor integrated circuit may further include a first VDD line and a first ground line. Each of the first VDD line and the first ground line may extend in the second direction. A supply power voltage of each of the SE inverter, the first multiplex part, the first master part, the first slave part and the first output part may be supplied via the first VDD line. A ground of each of the SE inverter, the first multiplex part, the first master part, the first slave part and the first output may be connected to the first ground line.

In example embodiments, the semiconductor integrated circuit may further include a second ground line extending in the second direction. A ground of each of the CK inverter, the second multiplex part, the second master part, the second slave part and the second output part may be connected to the first ground line.

In example embodiments, the semiconductor integrated circuit may further include a second VDD line extending in the second direction. A power supply voltage of each of the CK inverter, the second multiplex part, the second master part, the second slave part and the second output part may be supplied via the second VDD line.

According to example embodiments, in the semiconductor integrated circuit, an area occupied by the multi-bit flip-flop circuit may decrease. Thus, the semiconductor integrated circuit may be formed in a small horizontal area.

According to example embodiments, there is provided a flip-flop having an inverter with a first PMOS transistor and a first NMOS transistor. A first tri-state buffer has second and third PMOS transistors and second and third NMOS transistors. The first through third PMOS transistors are formed in a first active region, and the first through third NMOS transistors are formed in a second active region. A first portion of the first active region operates as the source for each of the first and second PMOS transistors. A first portion of the second active region operates as the source for each of the first and third NMOS transistors. A second portion of the first active region operates as the drain for the second PMOS transistor and the source for the third PMOS transistor. A second portion of the second active region operates as the drain for the third NMOS transistor and the source for the second PMOS transistor.

BRIEF DESCRIPTION OF THE DRAWINGS

Example embodiments will be more clearly understood from the following detailed description taken in conjunction with the accompanying drawings.

FIG. 1 is a circuit diagram illustrating a multi-bit flip-flop circuit.

FIG. 2 is an equivalent circuit diagram illustrating an input part and a multiplex part of the multi-bit flip-flop circuit in FIG. 1;

FIG. 3 is an exemplary block diagram illustrating an arrangement of each part of the multi-bit flip-flop circuit in FIGS. 1 and 2;

FIG. 4 is an exemplary layout illustrating a portion of the multi-bit flip-flop circuit according to the arrangement of FIG. 3;

FIG. 5 is an exemplary block diagram illustrating an arrangement of each part of the multi-bit flip-flop circuit in FIGS. 1 and 2;

FIG. 6 is an exemplary layout illustrating a portion of the multi-bit flip-flop circuit according to the arrangement of FIG. 5;

FIG. 7 is an exemplary block diagram illustrating an arrangement of each part of the multi-bit flip-flop circuit in FIG. 1;

FIG. 8 is an equivalent circuit diagram illustrating an input part and a multiplex part of the multi-bit flip-flop circuit according to the arrangement of FIG. 7;

FIG. 9 is an exemplary layout illustrating a portion of the multi-bit flip-flop circuit according to the arrangement of FIG. 7;

FIG. 10 is an exemplary block diagram illustrating an arrangement of each part of the multi-bit flip-flop circuit in FIGS. 1 and 8;

FIG. 11 is an exemplary layout illustrating a portion of the multi-bit flip-flop circuit according to the arrangement of FIG. 10;

FIG. 12 is an exemplary block diagram illustrating a triple-bits flip-flop circuit; and FIG. 13 is an exemplary block diagram illustrating a quadruple-bits flip-flop circuit.

DESCRIPTION OF EMBODIMENTS

Figure 1:
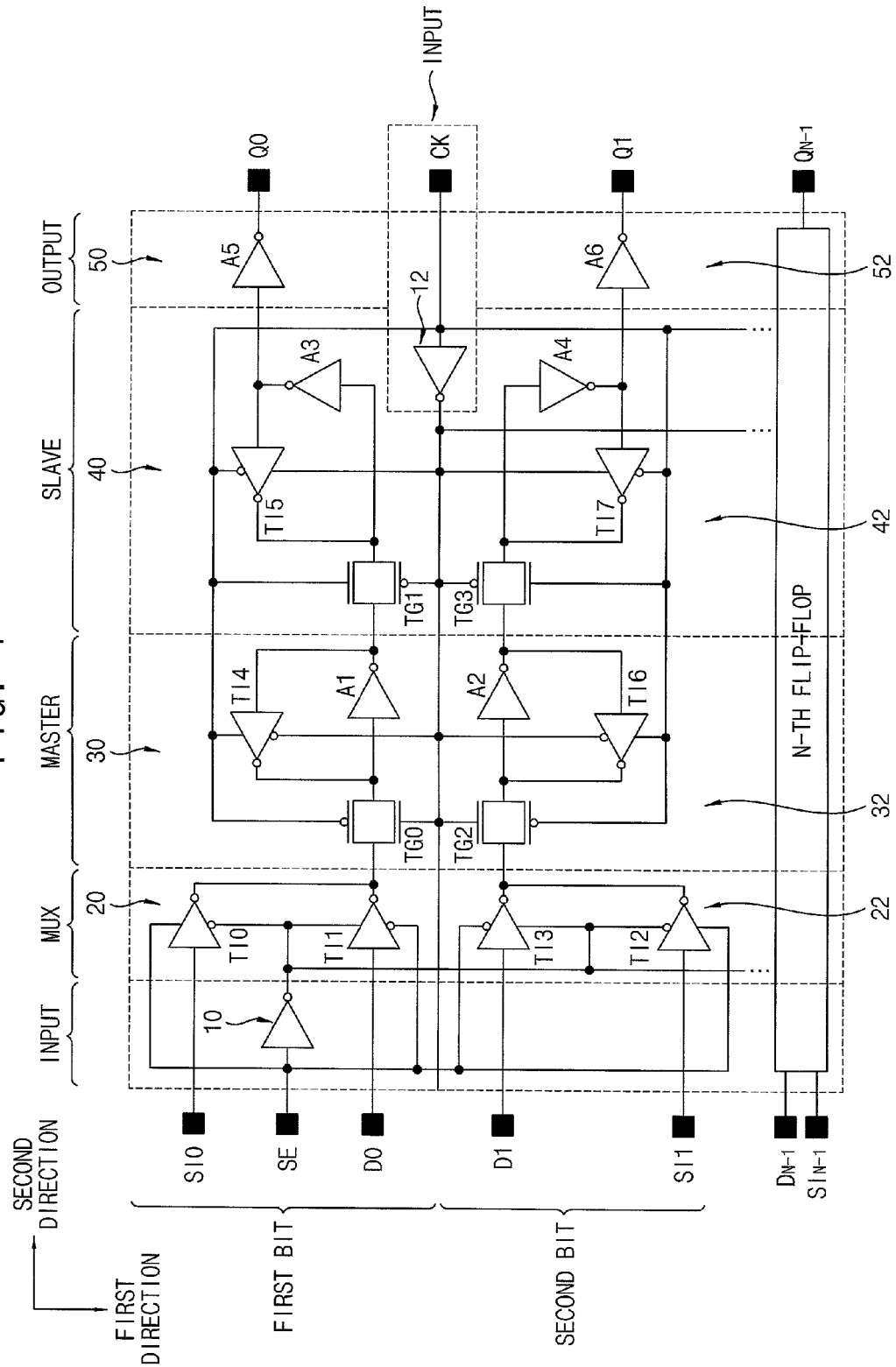
FIGS. 1 to 13 represent non-limiting, example embodiments as described herein.

Various example embodiments will be described more fully hereinafter with reference to the accompanying drawings, in which some example embodiments are shown. The present disclosure may, however, be embodied in many different forms and should not be construed as being limited to the example embodiments set forth herein. Rather, these example embodiments are provided so that this description will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
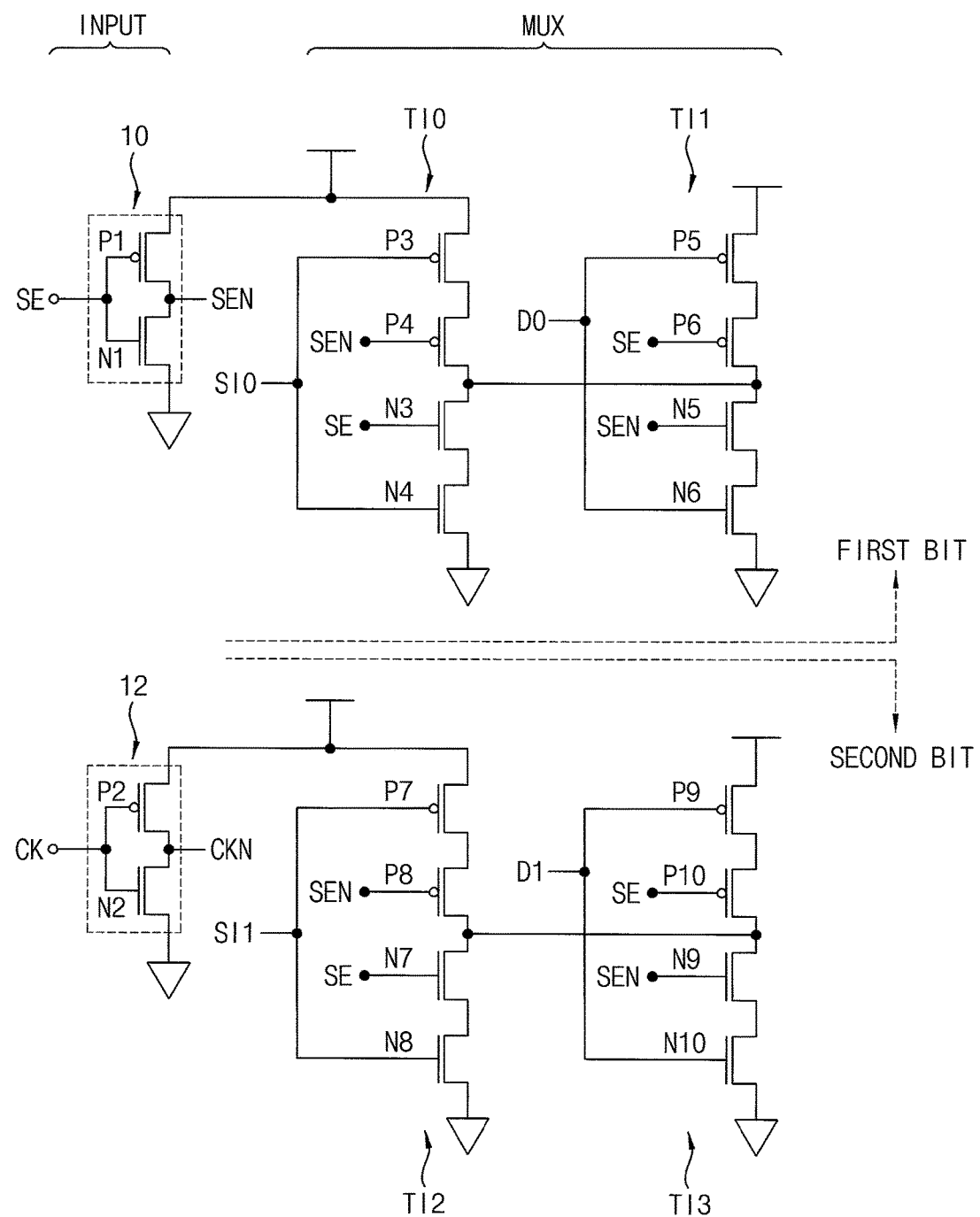

FIG. 1 is a circuit diagram illustrating a multi-bit flip-flop circuit. FIG. 2 is an equivalent circuit diagram illustrating an input part and a multiplex part of the multi-bit flip-flop circuit in FIG. 1.

In FIG. 2, each of P1, P2, P3, P4, P5, P6, P7, P8, P9 and P10 is a PMOS transistor, and each of N1, N2, N3, N4, N5, N6, N7, N8, N9 and N10 is an NMOS transistor.

Referring to FIGS. 1 and 2, a unit flip-flop circuit may include an input part INPUT, multiplex part MUX, a master part MASTER, a slave part SLAVE, and an output part OUTPUT. A plurality of unit flip-flop circuits may be repeatedly formed in a first direction to form a flip-flop circuit.

In example embodiments, the unit flip-flop circuit may process two or more bits. Hereinafter, the unit flip-flop circuit processing two bits will be illustrated. That is, a first bit may be processed at an upper portion of the unit flip-flop circuit, and a second bit may be processed at a lower portion of the unit flip-flop circuit.

The input part INPUT may include a scan enable (SE) inverter 10 and a clock (CK) inverter 12. In example embodiments, the unit flip-flop circuit may include only one SE inverter 10 and only one CK inverter 12. The SE inverter 10 may include transistors P1 and N1, and the CK inverter 12 may include transistors P2 and N2. The CK inverter 12 may generate a clock signal.

In the multiplex part MUX, data of the first and second bits may be latched at the master part MASTER and the slave part SLAVE by a response to the clock signal. The multiplex part MUX may include a first multiplex part 20 for processing the first bit and a second multiplex part 22 for processing the second bit. The first multiplex part 20 may include a first tri-state buffer T10 including transistors P3, P4, N3 and N4 and a second tri-state buffer T11 including transistors P5, P6, N5 and N6. The second multiplex part 22 may include a third tri-state buffer T12 including transistors P7, P8, N7 and N8 and a fourth tri-state buffer T13 including transistors P9, P10, N9 and N10.

The master part MASTER may include a first master latch part 30 for processing the first bit and a second master latch part 32 for processing the second bit.

The first master latch part 30 may include a first transmission gate TG0, a fifth tri-state buffer T14 and a first inverter A1. The fifth tri-state buffer T14 may include two PMOS transistors and two NMOS transistors, and the first inverter A1 may include one PMOS transistor and one NMOS transistor. The second master latch part 32 may include a second transmission gate TG2, a sixth tri-state buffer T16 and a second inverter A2. The sixth tri-state buffer T16 may include two PMOS transistors and two NMOS transistors, and the second inverter A2 may include one PMOS transistor and one NMOS transistor.

The slave part SLAVE may include a first slave latch part 40 for processing the first bit and a second slave latch part 42 for processing the second bit. The first slave latch part 40 may include a third transmission gate TG1, a seventh tri-state buffer T15 and a third inverter A3. The seventh tri-state buffer T15 may include two PMOS transistors and two NMOS transistors, and the third inverter A3 may include one PMOS transistor and one NMOS transistor. The second slave latch part 42 may include a fourth transmission gate TG3, an eighth tri-state buffer T17 and a fourth inverter A4. The eighth tri-state buffer T17 may include two PMOS transistors and two NMOS transistors, and the fourth inverter A4 may include one PMOS transistor and one NMOS transistor.

The output part OUTPUT may include a first output part 50 for processing the first bit and a second output part 52 for processing the second bit. The first output part 50 may include a first output inverter A5 including one PMOS transistor and one NMOS transistor. The second output part 52 may include a second output inverter A6 including one PMOS transistor and one NMOS transistor.

The unit flip-flop circuit may be formed on a semiconductor substrate. Hereinafter, a layout of the unit flip-flop circuit will be illustrated.

Figure 3:
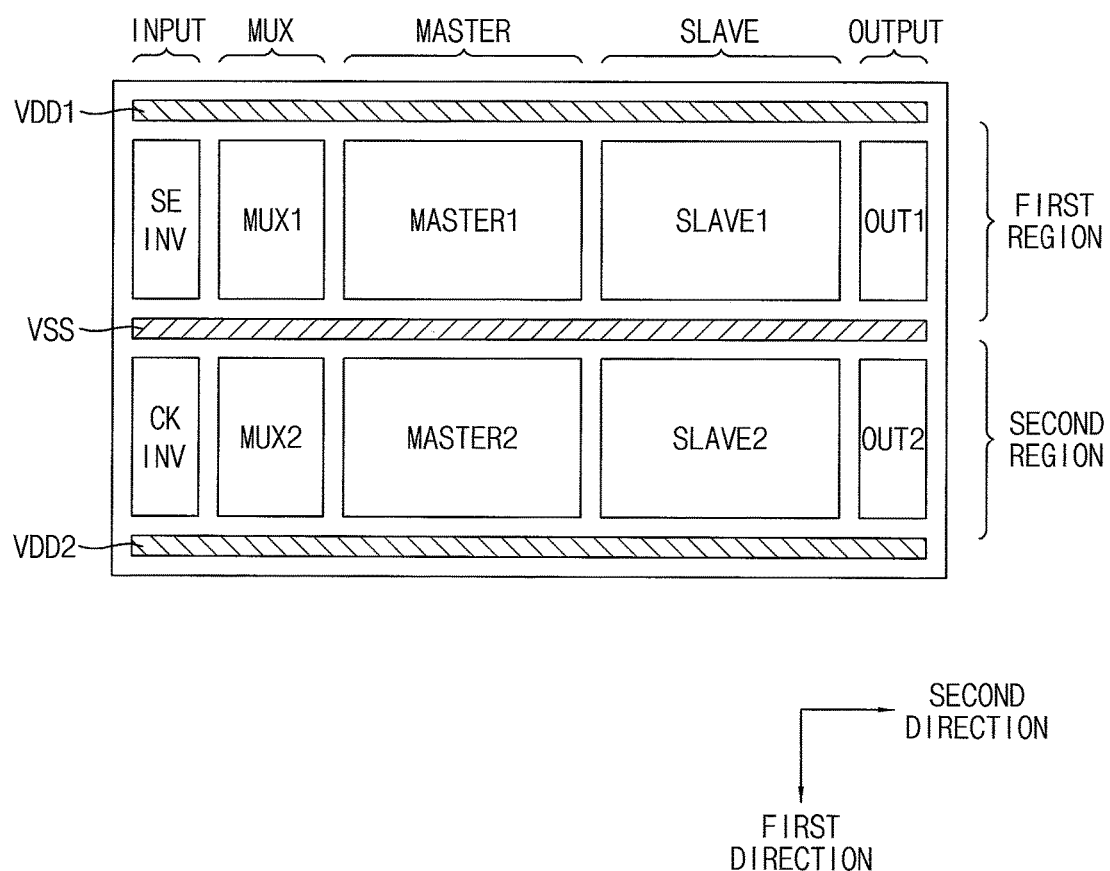
Figure 4:
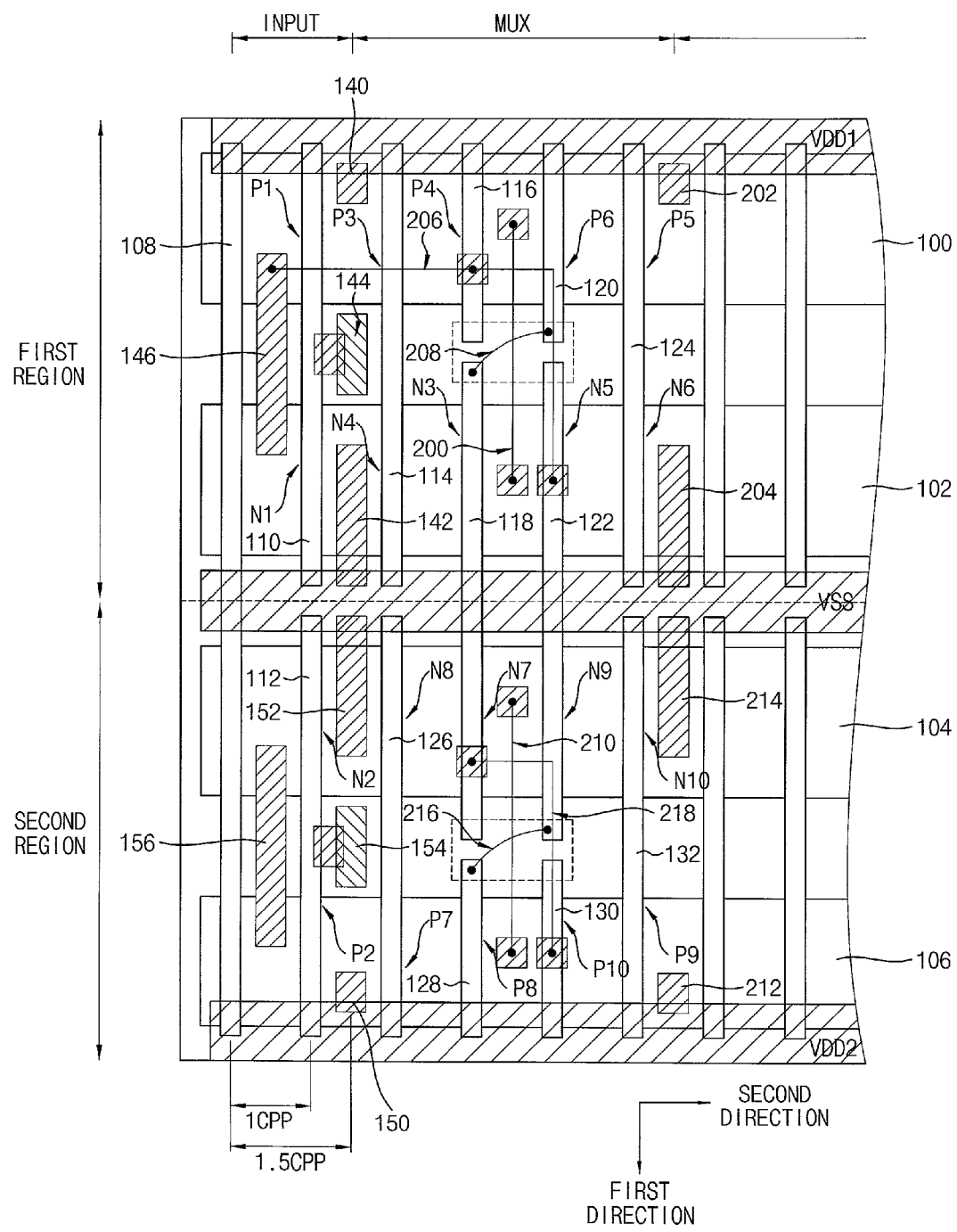

FIG. 3 is an exemplary block diagram illustrating an arrangement of the parts of the multi-bit flip-flop circuit in FIGS. 1 and 2. FIG. 4 is an exemplary layout illustrating a portion of the multi-bit flip-flop circuit according to the arrangement of FIG. 3.

FIG. 4 is a layout of the input part INPUT and the multiplex part MUX of the unit flip-flop circuit.

In FIGS. 2 and 4, the same reference numerals may be given to the same elements of corresponding transistors.

Referring to FIGS. 3 and 4, the unit flip-flop circuit may be formed on a first region and a second region of a semiconductor substrate. A first circuit for processing the first bit may be formed on the first region, and a second circuit for processing the second bit may be formed on the second region. The first and second regions may be located in a first direction in this order. The first direction may be substantially parallel to a top surface of the substrate. A second direction may be substantially perpendicular to the first direction, and be substantially parallel to the top surface of the substrate.

In example embodiments, as shown in FIG. 3, the input part INPUT, the multiplex part MUX, the master part MASTER, the slave part SLAVE and the output part OUTPUT may be sequentially arranged in the second direction in this order from left to right, and may be formed in the first and second regions.

Alternatively, the input part INPUT, the multiplex part MUX, the master part MASTER, the slave part SLAVE and the output part OUTPUT may be sequentially arranged in the second direction in this order from right to left, and may be formed in the first and second regions. In this case, the layout of the unit flip-flop circuit may be reversed in the second direction to the layout described below.

In example embodiments, each of the input part INPUT, the multiplex part MUX, the master part MASTER, the slave part SLAVE and the output part OUTPUT may be disposed in the first direction on the first and second regions.

In example embodiments, the first region may include a first active region 100 for forming a PMOS transistor and a second active region 102 for forming an NMOS transistor. The second region may include a third active region 104 for forming an NMOS transistor and a fourth active region 106 for forming a PMOS transistor. In the first and fourth active regions 100 and 106, a channel region of a transistor may be doped with n-type impurities, and source/drain regions of the transistor may be doped with p-type impurities. In the second and third active regions 102 and 104, a channel region of a transistor may be doped with p-type impurities, and source/drain regions of the transistor may be doped with n-type impurities.

Hereinafter, an impurity region adjacent to a left side of a gate is referred to as a drain region, and an impurity region adjacent to a right side of the gate is referred to as a source region.

The first, second, third and fourth active regions 100, 102, 104 and 106 may be disposed in the first direction in this order from top to bottom. Each of the first to fourth active regions 100, 102, 104 and 106 may extend in the second direction. In example embodiments, each of the first to fourth active regions 100, 102, 104 and 106 may extend from the input part to the master part. Also, each of the slave part SLAVE and the output part OUTPUT may include the first to fourth active regions 100, 102, 104 and 106.

In example embodiments, a first VDD line VDD1 for supplying a power supply voltage may be formed at an upper portion of the first region. The first VDD line VDD1 may be formed adjacent to an upper portion of the first active region 100 in the first direction. The first VDD line VDD1 may extend in the second direction to both edge portions of the first region. The power supply voltage may be supplied to the first circuit by the first VDD line VDD1.

In example embodiments, a ground line (VSS) may be formed between the first and second regions. The ground line VSS may be formed between the second and third active regions 102 and 104. The ground line VSS may extend in the second direction to both edge portions of the first and second regions. The ground line VSS may serve as a common ground line of the first and second circuits.

In example embodiments, a second VDD line VDD2 for supplying a power supply voltage may be formed at a lower portion of the second region. The second VDD line VDD2 may be formed adjacent to a lower portion in the first direction of the fourth active region 106. The second VDD line VDD2 may extend in the second direction to both edge portions of the second region. The power supply voltage may be supplied to the second circuit by the second VDD line VDD2.

In example embodiments, the SE inverter may be formed in the input part INPUT of the first region, and the CK inverter may be formed in the input part INPUT of the second region.

The SE inverter may include a first gate 110. The first gate 110 may be formed on the first and second active regions 100 and 102, and may extend in the first direction. That is, the first gate 110 may overlap the first and second active regions 100 and 102. A first P drain region and a first P source region may be formed at the first active region 100 adjacent to opposite sidewalls, respectively, of the first gate 110. Thus, a PMOS transistor P1 may be formed on the first active region 100. A first N drain region and a first N source region may be formed at the second active region 102 adjacent to opposite sidewalls, respectively, of the first gate 110. Thus, an NMOS transistor N1 may be formed on the second active region 102.

A first wiring 140 for supplying the power supply voltage may be formed on the first P source region. In example embodiments, the first wiring 140 may connect the first P source region and the first VDD line to each other. The first wiring 140 may include, e.g., a contact plug, a conductive pattern, a pad structure, etc.

A second wiring 142 for being connected to the ground line VSS may be formed on the first N source region. In example embodiments, the second wiring 142 may connect the first N source region to the ground line VSS. The second wiring 142 may include, e.g., a contact plug, a conductive pattern, a pad structure, etc.

A third wiring 144 may be formed on the first gate 110. A first SE signal may be supplied to the first gate 110 by the third wiring 144.

A fourth wiring 146 may connect the first P drain region and the first N drain region to each other. A second SE signal SEN, which is a reversed first SE signal, may be outputted by the fourth wiring 146.

That is, in the SE inverter, a signal SEN may be outputted via the fourth wiring 146 adjacent to a left side of the first gate 110. In the SE inverter, the power supply voltage may be supplied via the first wiring 140 adjacent to a right side of the first gate 110. Thus, the power supply voltage of the SE inverter may be supplied from a region adjacent to the multiplex part MUX. The fourth wiring 146 may be disposed farther away from the multiplex part MUX than the first wiring 140.

The CK inverter may include a second gate 112. The second gate 112 may be formed on the third and fourth regions 104 and 106, and may extend in the first direction. That is, the second gate 112 may overlap the third and fourth active regions 104 and 106. A second N drain region and a second N source region may be formed at the third active region 104 adjacent to opposite sidewalls, respectively, of the second gate 112. Thus, an NMOS transistor N2 may be formed on the third active region 104. A second P drain region and a second P source region may be formed at the fourth active region 106 adjacent to opposite sidewalls, respectively, of the second gate 112. Thus, a PMOS transistor P2 may be formed on the fourth active region 106.

The second gate 112 may be aligned in the first direction to the first gate 110. Thus, P1, N1, N2 and P2 may be aligned in the first direction.

A fifth wiring 150 for supplying the power supply voltage may be formed on the second P source region. In example embodiments, the fifth wiring 150 may connect the second P source region and the second VDD line VDD2 to each other. The fifth wiring 150 may include, e.g., a contact plug, a conductive pattern, a pad structure, etc.

A sixth wiring 152 for being connected to the ground line VSS may be formed on the second N source region. In example embodiments, the sixth wiring 152 may connect the second N source region to the ground line VSS. The sixth wiring 152 may include, e.g., a contact plug, a conductive pattern, a pad structure, etc.

A seventh wiring 154 may be formed on the second gate 112. A first CK signal may be supplied to the second gate 112 by the seventh wiring 154.

An eighth wiring 156 may connect the second P drain region and the second N drain region to each other. A second CK signal CKN, that is a reversed first CK signal, may be outputted by the eighth wiring 156.

That is, in the CK inverter, a signal CKN may be outputted via the eighth wiring 156 adjacent to a left side of the second gate 112. In the CK inverter, the power supply voltage may be supplied via the fifth wiring 150 adjacent to a right side of the second gate 112. Thus, the power supply voltage of the CK inverter may be supplied from a region adjacent to the multiplex part MUX. The eighth wiring 156 may be disposed farther away from the multiplex part MUX than the fifth wiring 150.

In example embodiments, an additional clock inverter being connected to the CK inverter for generating a reversed second CK signal may not be formed. That is, the unit flip-flop circuit may include only one CK inverter, and thus the CK inverter and the SE inverter may be aligned in the first direction to each other. The CK inverter and the SE inverter may be formed on areas of the substrate having substantially the same size, which may be reduced.

In example embodiments, a first multiplex part may be formed on the first region, and a second multiplex part may be formed on the second region.

In the first multiplex part, the first tri-state buffer may be formed adjacent to the SE inverter, and the second tri-state buffer may be formed adjacent to a right side of the first tri-state buffer. In example embodiments, an impurity region of a PMOS transistor P3 and a wiring of the first tri-state buffer to which the power supply voltage may be applied may also serve as the first P source region of the SE inverter and the first wiring 140, respectively.

In the second multiplex part, the third tri-state buffer may be formed adjacent to the CK inverter, and the fourth tri-state buffer may be formed adjacent to a right side of the third tri-state buffer. In example embodiments, an impurity region of the PMOS transistor P7 and a wiring of the third tri-state buffer to which the power supply voltage may be applied may also serve as the second P source region of the CK inverter and the fifth wiring 150, respectively.

As described above, the first VDD line VDD1 for supplying the power supply voltage may be used commonly in the SE inverter and the first multiplex part. Also, the second VDD line VDD2 may be used commonly in the CK inverter and the second multiplex part. Thus, a horizontal area of the substrate for forming the flip-flop circuit may be reduced.

Hereinafter, a layout of the first to fourth tri-state buffers will be particularly illustrated.

The first tri-state buffer may include a third gate 114, a fourth gate 116 and a fifth gate 118. The third gate 114 may be spaced apart from the first gate 110 in the second direction, and the fourth and fifth gates 116 and 118 may be spaced apart from the third gate 114 in the second direction.

The third gate 114 may be formed on the first and second active regions 100 and 102, and may extend in the first direction. The fourth gate 116 may be formed on the first active region 100, and may extend in the first direction. The fifth gate 118 may be formed on the second and third active regions 102 and 104, and may extend in the first direction.

A third P drain region and a third P source region may be formed at the first active region 100 adjacent to opposite sidewalls, respectively, of the third gate 114. Thus, an NMOS transistor P3 may be formed on the first active region 100.

The first active region 100 between the first and third gates 110 and 114 may serve as both of a third P drain region and the first P source region. That is, P3 and P4 may share the first active region 100 between the first and third gates 110 and 114 as the third P drain region and the first P source region, respectively.

A fourth P drain region and a fourth P source region may be formed at the first active region 100 adjacent to opposite sidewalls, respectively, of the fourth gate 116. P3 and P4 may share the third P source region and fourth P drain region. Thus, a PMOS transistor P4 may be formed on the first active region, and P4 and P3 may be connected with each other.

A third N drain region and a third N source region may be formed at the second active region 102 adjacent to opposite sidewalls, respectively, of the fifth gate 118. Thus, an NMOS transistor N3 may be formed on the second active region 102.

A fourth N drain region and a fourth N source region may be formed at the second active region 102 adjacent to opposite sidewalls, respectively, of the third gate 114. Thus, an NMOS transistor N4 may be formed on the second active region, and N3 and N4 may be connected with each other.

In the first tri-state buffer, a ninth wiring 200 may electrically connect the fourth P source region and the third N source region to each other.

As the third P drain region may also serve as the first P source region, a wiring for supplying the power supply voltage to P3 may share the first wiring 140. Thus, the first tri-state buffer may not include an additional wiring for supplying the power supply voltage, and the power supply voltage may be supplied from the first VDD line VDD1 via the first wiring 140.

The fourth N drain region may also serve as the first N source region, so that a wiring of N4 for being connected to a ground level may also serve as the second wiring 142. Thus, the first tri-state buffer may not include an additional wiring for being connected to the ground level. That is, the first tri-state buffer may be connected to the ground line VSS via the second wiring 142.

The second tri-state buffer may include a sixth gate 120, a seventh gate 122 and an eighth gate 124. The sixth and seventh gates 120 and 122 may be spaced apart from the fourth and fifth gates 116 and 118, respectively, in the second direction, and the eighth gate 124 may be spaced apart from the sixth and seventh gates 120 and 122 in the second direction.

The sixth gate 120 may be formed on the first active region, and may extend in the first direction. The seventh gate 122 may be formed on the second and third active regions, and may extend in the first direction. The eighth gate 124 may be formed on the first and second active regions, and may extend in the first direction.

A fifth P drain region and a fifth P source region may be formed at the first active region 100 adjacent to opposite sidewalls, respectively, of the eighth gate 124. Thus, a PMOS transistor P5 may be formed on the first active region 100.

A sixth P drain region and a sixth P source region may be formed at the first active region 100 adjacent to opposite sidewalls, respectively, of the sixth gate 120. Thus, a PMOS transistor P6 may be formed on the first active region 100, and P5 and P6 may be connected with each other.

A fifth N drain region and a fifth N source region may be formed at the second active region 102 adjacent to opposite sidewalls, respectively, of the seventh gate 122. Thus, an NMOS transistor N5 may be formed on the second active region 102.

A sixth N drain region and a sixth N source region may be formed at the second active region 102 adjacent to opposite sidewalls, respectively, of the eighth gate 124. Thus, an NMOS transistor N6 may be formed on the second active region 102, and N5 and N6 may be connected with each other.

In the second tri-state buffer, the ninth wiring 200 may electrically connect the sixth P source region and the fifth N source region to each other. The sixth P drain region may also serve as the fourth P source region, and the third N source region may also serve as the fifth N drain region. Thus, the ninth wiring 200 may be commonly used for connecting the fourth P source region and the third N source region to each other.

A tenth wiring 202 for supplying a first VDD VDD1 may be formed on the fifth P source region. The tenth wiring 202 may be electrically connected to the first VDD line VDD1.

An eleventh wiring 204 for being connected the ground level may be formed on the sixth N source region. The eleventh wiring 204 may be electrically connected to the ground line VSS.

Further, a twelfth wiring 206 may be formed on the gate of P4 and N5. Output signals of the SE inverter may be transferred to the gates of P4 and N5 by the twelfth wiring 206. A thirteenth wiring 208 for connecting the gates of P6 and N3 to each other may be formed.

The third tri-state buffer may include a ninth gate 126, the fifth gate 118 and a tenth gate 128. The ninth gate 126 may be spaced apart from the second gate 112 in the second direction, the fifth gate 118 and the tenth gate 128 may be spaced apart from the ninth gate 126 in the second direction.

The ninth gate 126 may be formed on the third and fourth active regions 104 and 106, and may extend in the first direction. The tenth gate 128 may be formed on the fourth active region 106, and may extend in the first direction.

The ninth gate 126 may be aligned in the first direction with the third gate 114, and the tenth gate 128 gate may be aligned in the first direction with the fifth gate 118.

An eighth N drain region and an eighth N source region may be formed at the third active region 104 adjacent to opposite sidewalls, respectively, of the ninth gate 126. Thus, an NMOS transistor N8 may be formed on the third active region 104.

A seventh N drain region and a seventh N source region may be formed at the third active region 104 adjacent to opposite sidewalls, respectively, of the fifth gate 118. Thus, an NMOS transistor N7 may be formed on the third active region 104, and N8 and N7 may be connected with each other. The fifth gate 118 may also serve as a gate of N3.

A seventh P drain region and a seventh P source region may be formed at the fourth active region 106 adjacent to opposite sidewalls, respectively, of the ninth gate 126. Thus, a PMOS transistor P7 may be formed on the fourth active region 106.

An eighth P drain region and an eighth P source region may be formed at the fourth active region 106 adjacent to opposite sidewalls, respectively, of the tenth gate 128. Thus, a PMOS transistor P8 may be formed on the fourth active region 106, and P7 and P8 may be connected with each other.

In the third tri-state buffer, a fourteenth wiring 210 may electrically connect the seventh N source region and the eight P source region to each other.

As the seventh P drain region may also serve as the second P source region, a wiring for supplying the power supply voltage to P7 may also serve as the fifth wiring 150. Thus, the third tri-state buffer may not include an additional wiring for supplying the power supply voltage, and the power supply voltage may be supplied to the third tri-state buffer via the fifth wiring 150.

The eighth N drain region may also serve as the second N source region, so that a wiring of N8 for being connected to the ground level may also serve as the sixth wiring 152. Thus, the third tri-state buffer may not include an additional wiring for being connected to the ground level, and may be connected to the ground line VSS via the sixth wiring 152.

The fourth tri-state buffer may include a tenth gate 128, an eleventh gate 130 and a twelfth gate 132. The eleventh gate 130 may be spaced apart from the tenth gate 128 in the second direction, and the twelfth gate 132 may be spaced apart from the seventh and eleventh gates 122 and 130 in the second direction.

The eleventh gate 130 may be formed on the fourth active region 106, and may extend in the first direction. The twelfth gate 132 may be formed on the third and fourth active regions 104 and 106, and may extend in the first direction.

The eleventh gate 130 and the seventh gate 122 may be aligned in the first direction to each other, and the twelfth gate 132 and the eighth gate 124 may be aligned in the first direction to each other.

A ninth N drain region and a ninth N source region may be formed at the third active region 104 adjacent to opposite sidewalls, respectively, of the seventh gate 122. Thus, an NMOS transistor N9 may be formed on the third active region 104.

A tenth N drain region and a tenth N source region may be formed at the third active region 104 adjacent to opposite sidewalls, respectively, of the twelfth gate 132. Thus, an NMOS transistor N10 may be formed on the third active region 104, and N9 and N10 may be connected with each other.

A tenth P drain region and a tenth P source region may be formed at the fourth active region 106 adjacent to opposite sidewalls, respectively, of the eleventh gate 130. Thus, a PMOS transistor P10 may be formed on the fourth active region 106.

A ninth P drain region and a ninth P source region may be formed at the fourth active region 106 adjacent to opposite sidewalls, respectively, of the twelfth gate 132. Thus, a PMOS transistor P9 may be formed on the fourth active region 106, and P9 and P10 may be connected with each other.

In the fourth tri-state buffer, the fourteenth wiring 210 may electrically connect the ninth N drain region and the tenth P drain region to each other. The ninth N drain region may also serve as the seventh N source region, and the tenth P drain region may also serve as the eighth P source region. Thus, the fourteenth wiring 210 may be commonly used for connecting the seventh N drain region and the eighth P drain region to each other.

A fifteenth wiring 212 for supplying the power supply voltage may be formed on the ninth P source region. The fifteen wiring 212 may be electrically connected to the second VDD line VDD2.

A sixteenth wiring 214 for being connected to the ground level may be formed on the tenth N source region. The sixteenth wiring 214 may be electrically connected to the ground line VSS.

Further, a wiring may be formed on the gate of N9 and P8. Output signals of the SE inverter may be transferred to the gate of N9 and P8 by the wiring. That is, a seventeenth wiring 216 for connecting the seventh gate 122 of N9 to the tenth gate 128 of P8 may be formed. The seventh gate 122 may be commonly used as the gates of N9 and N5, so that the output signals of the SE inverter may be transferred to the gate of the N9 and P8 via the seventeenth wiring 216.

An eighteenth wiring 218 for connecting the fifth gate 118 of N7 to the eleventh gate 130 of P10 may be formed.

In example embodiments, the transistors included in the third tri-state buffer and the transistors included in the first tri-state buffer may be symmetric with respect to the ground line VSS. The transistors included in the fourth tri-state buffer and the transistors included in the second tri-state buffer may be symmetric with respect to the ground line VSS.

As described above, the first tri-state buffer and the third tri-state buffer may be aligned in the first direction to each other. The second tri-state buffer and the fourth tri-state buffer may be aligned in the first direction to each other. The first tri-state buffer and the SE inverter may use a common power supply voltage from the first VDD line VDD1. The third tri-state buffer and the CK inverter may use a common power supply voltage from the second VDD line VDD2.

In example embodiments, a dummy gate 108 may be formed on the first, second, third and fourth active regions 100, 102, 104 and 106 adjacent to a left side of the first gate 110, and may extend in the first direction. The dummy gate 108 may serve as a diffusion barrier layer of impurities. Also, a uniformity of pattern density may be increased by the dummy gate 108.

In example embodiments, the first to twelfth gates 110, 112, 114, 116, 118, 120, 122, 124, 126, 128, 130 and 132 formed in the input part INPUT and the multiplex part MUX may not be bent, and may extend in the first direction. Thus, wirings formed on the gates and source/drain region adjacent to sidewalls of the gates may be easily arranged.

In example embodiments, the first to twelfth gates 110, 112, 114, 116, 118, 120, 122, 124, 126, 128, 130 and 132 may have substantially the same width in the second direction. The first to twelfth gates 110, 112, 114, 116, 118, 120, 122, 124, 126, 128, 130 and 132 may be spaced apart from each other by a regular distance in the second direction. In example embodiments, the gates 110, 112, 114, 116, 118, 120, 122, 124, 126, 128, 130 and 132 may be spaced apart from each other by a minimum distance in accordance with wirings formed on the source/drain regions.

For example, a distance in the second direction between a central portion of one gate (e.g., a first gate) and a central portion of a neighboring gate (e.g., a third gate) may be referred to as one gate pitch (1 CPP). In this case, each of the SE inverter and the CK inverter may be formed within an area of equal to or less than about 1.5 CPP in the second direction.

As shown in FIG. 1, the master part MASTER, the slave part SLAVE and the output part OUTPUT may be sequentially formed next to the multiplex part MUX. A layout of each of the master part MASTER, the slave part SLAVE and the output part OUTPUT may not be limited, and may have various types.

The master part MASTER may be formed adjacent to the right side of the multiplex part MUX.

The first master latch part MASTER1 may be formed in the first region, and the second master latch part MASTER2 may be formed in the second region. The first and second master latch parts MASTER1 and MASTER2 may be aligned in the first direction to each other. Each of the first and second master latch parts MASTER1 and MASTER2 may include a transmission gate, a tri-state buffer and a CMOS inverter, etc.

In example embodiments, the gates included in the first and second master latch parts MASTER1 and MASTER2 may extend in the first direction, and may be aligned in the first direction to each other.

The first and second master latch parts MASTER1 and MASTER2 may include substantially the same circuit. In example embodiments, the gates included in the first master latch part MASTER1 and the gates included in the second master latch part MASTER2 may be symmetric with respect to the ground line VSS.

The slave part SLAVE may be formed adjacent to the right side of the master part MASTER.

The first slave latch part SLAVE1 may be formed in the first region, and the second slave latch part SLAVE2 may be formed in the second region. The first and second slave latch parts SLAVE1 and SLAVE2 may be aligned in the first direction to each other. Each of the first and second slave latch parts SLAVE1 and SLAVE2 may include a transmission gate, a tri-state buffer and a CMOS inverter, etc.

In example embodiments, the gates included in the first and second slave latch parts SLAVE1 and SLAVE2 may extend in the first direction, and may be aligned in the first direction to each other.

The first and second slave latch parts SLAVE1 and SLAVE2 may include substantially the same circuit. In example embodiments, the gates included in the first slave latch part SLAVE1 and the gates included in the second slave latch part SLAVE2 may be symmetric with respect to the ground line VSS.

The output part OUTPUT may be formed adjacent to the right side of the slave part SLAVE.

The first output part OUT1 may be formed in the first region, and the second output part OUT2 may be formed in the second region. The first and second output parts OUT1 and OUT2 may be aligned in the first direction to each other.

The multiplexer part MUX may be formed adjacent to the left side of the master part MASTER.

The first multiplexer part MUX1 may be formed in the first region, and the second multiplexer part MUX2 may be formed in the second region. The first and second multiplexer parts MUX1 and MUX2 may be aligned in the first direction to each other.

Figure 5:
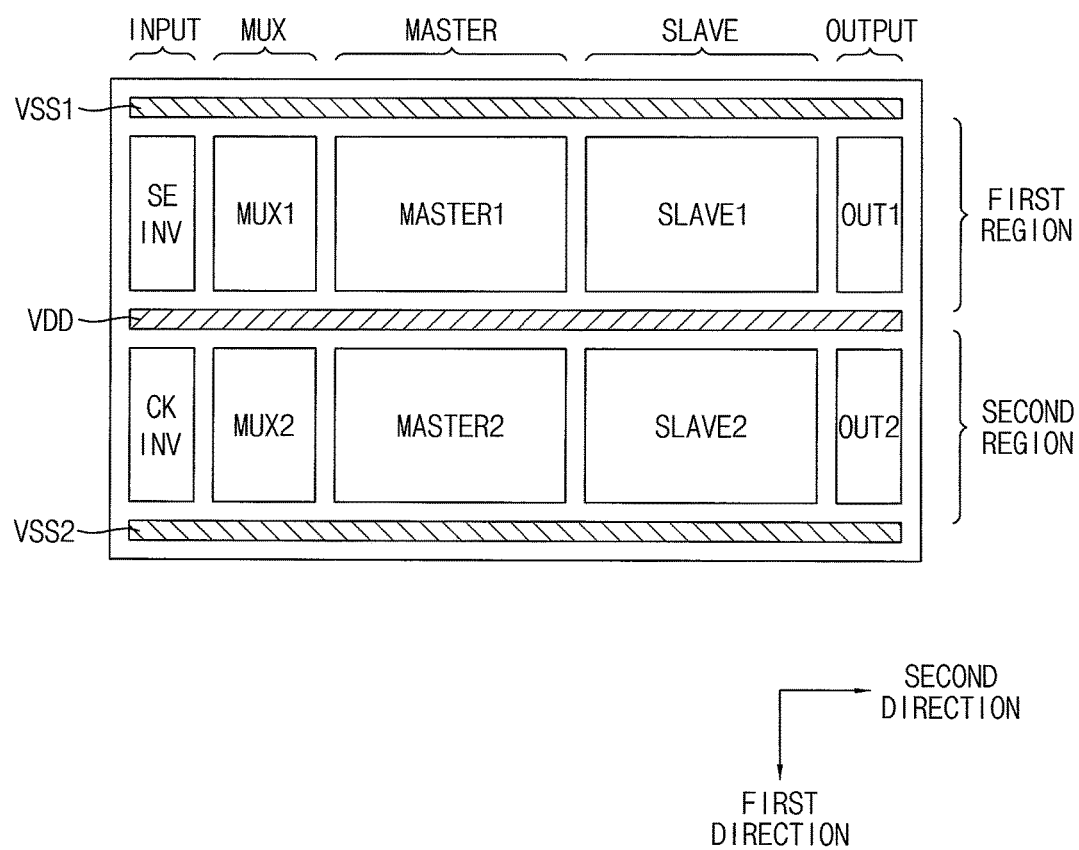
Figure 6:
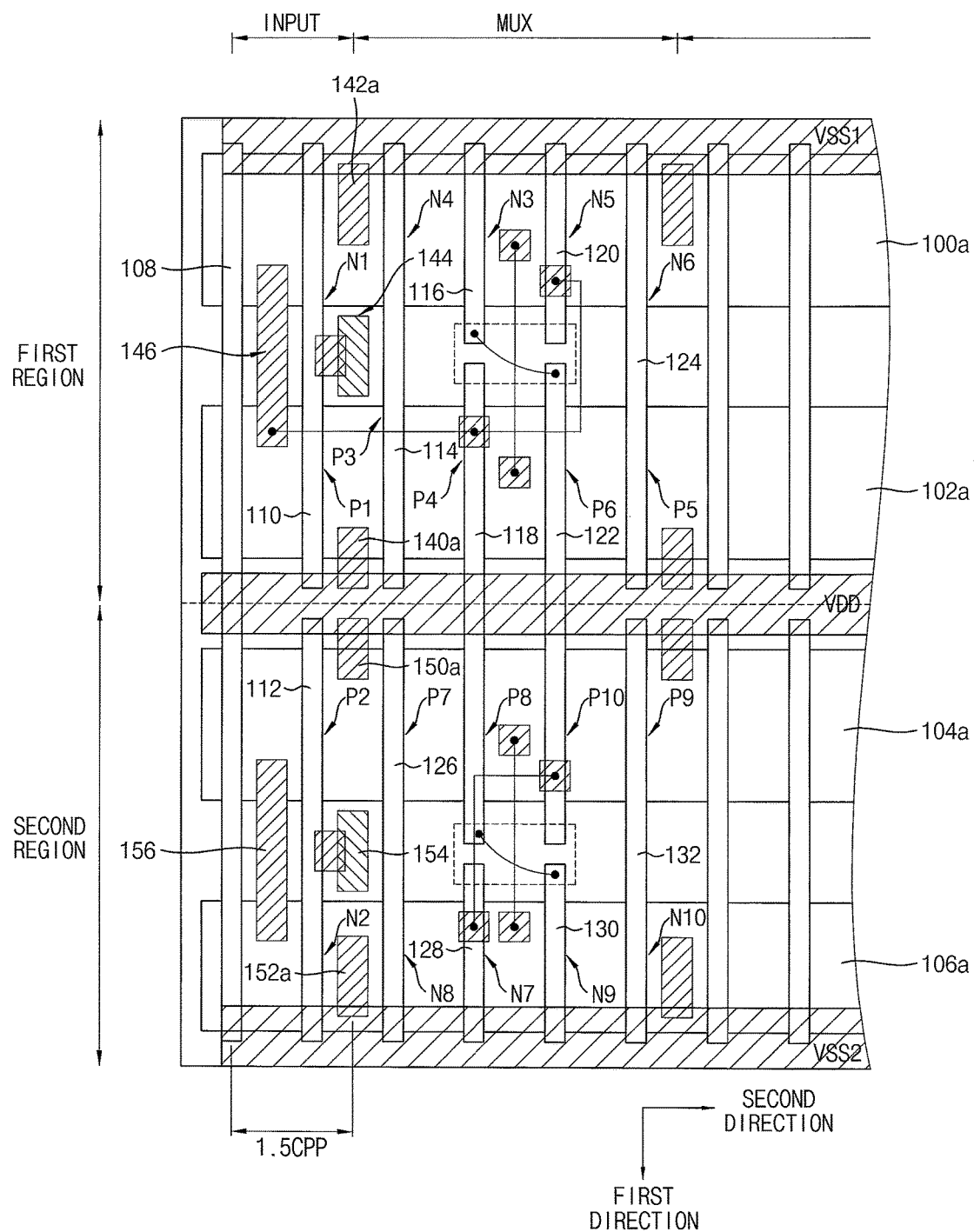

FIG. 5 is an exemplary block diagram illustrating an arrangement of parts of the multi-bit flip-flop circuit in FIGS. 1 and 2. FIG. 6 is an exemplary layout illustrating a portion of the multi-bit flip-flop circuit according to the arrangement of FIG. 5.

In FIGS. 2 and 6, same reference numerals may be given to same elements of corresponding transistors.

Referring to FIGS. 5 and 6, the flip-flop circuit may be formed in the first and second regions of a substrate. The flip-flop circuit may include an input part INPUT, a multiplex part MUX, a master part MASTER, a slave part SLAVE and an output part OUTPUT in first and second regions, which may be arranged in this order from left to right in the second direction, as illustrated with reference to FIG. 3. However, positions of the VDD line and the ground line may be different from those of the flip-flop circuit of FIG. 3.

Particularly, the first region may include a first active region 100a and a second active region 102a, and the second region may include a third active region 104a and a fourth active region 106a.

In example embodiments, the first ground line VSS1 may be formed at an upper portion of the first region. The first ground line VSS1 may be formed adjacent to an upper portion of the first active region 100a in the first direction. The first ground line VSS1 may extend in the second direction to both edge portions of the first region. A first circuit formed in the first region may be connected to a ground level via the first ground line VSS1.

In example embodiments, a VDD line for supplying a power supply voltage may be formed between the first and second regions. The VDD line may be formed between the second and third active regions 102a and 104a. The VDD line may extend in the second direction to both edge portions of the first and second regions. The power supply voltage may be supplied to the first circuit formed in the first region 100a and a second circuit formed in the second region 102a via the VDD line.

In example embodiments, a second ground line VSS2 may be formed at a lower portion of the second region. The second ground line VSS2 may be formed adjacent to a lower portion in the first direction of the fourth active region 106a. The second ground line VSS2 may extend in the second direction to both edge portions of the second region. The second circuit formed in the second region may be connected to a ground level via the second ground line VSS2.

According to positions of the ground lines VSS1 and VSS2 and the VDD lines, positions of the NMOS transistors and the PMOS transistors included in the first and second circuits may be changed. That is, the PMOS transistors may be formed to be adjacent to the VDD line, and the NMOS transistors may be formed to be adjacent to the first ground line VSS1 or the second ground line VSS2.

Referring to FIG. 6, the NMOS transistors may be formed on the first and fourth active regions 100a and 106a. The PMOS transistors may be formed on the second and third active regions 102a and 104a. Thus, in the first and fourth active regions 100a and 106a, a channel region of a transistor may be doped with p-type impurities, and source/drain regions of the transistor may be doped with n-type impurities. In the second and third active regions 102a and 104a, a channel region of a transistor may be doped with n-type impurities, and source/drain regions of the transistor may be doped with p-type impurities.

In example embodiments, first to twelfth gates 110, 112, 114, 116, 118, 120, 124, 126, 128, 130 and 132 included in the input part INPUT and the multiplex part MUX may be substantially the same as the first to twelfth gates 110, 112, 114, 116, 118, 120, 124, 126, 128, 130 and 132 illustrated with reference to FIG. 4. However, the conductivities of the transistors on the active regions may be reversed, and an arrangement of wirings may be changed. The transistors may be electrically connected to each other by the wiring so that the circuits shown in FIG. 2 may be formed.

The SE inverter and the CK inverter may be formed in the input part INPUT, and may be aligned in the first direction. Thus, each of the SE inverter and the CK inverter may be formed within an area of equal to or less than about 1.5 CPP in the second direction.

In example embodiments, P1 of the SE inverter may be formed on the second active region 102a. A first P source region of P1 and a first wiring 140a may be electrically connected to the VDD line. An impurity region and a wiring of the first tri-state buffer to which the power supply voltage may be applied may also serve as the first P source region of the SE inverter and the first wiring 140a, respectively.

In example embodiments, P2 of the CK inverter may be formed on the third active region 104a. A second P source region of the P2 and a fifth wiring 150a may be electrically connected to the VDD line. An impurity region of the PMOS transistor and a wiring of the first tri-state buffer to which the power supply voltage may be applied may also serve as the second P source region and the fifth wiring 150a of the SE inverter, respectively.

The SE inverter may include a third wiring 144 for inputting the first SE signal and a fourth wiring 146 for outputting the second SE signal SEN, which may be a reversed first SE signal. The third wiring 144 and the fourth wiring 146 may be substantially the same as the third wiring 144 and the fourth wiring 146 illustrated with reference to FIG. 4.

The CK inverter may include a seventh wiring 154 for inputting the first clock signal and an eighth wiring 156 for outputting the second clock signal CKN, which may be a reversed first clock signal. The seventh wiring 154 and the eighth wiring 156 may be substantially the same as the seventh wiring 154 and the eighth wiring 156 illustrated with reference to FIG. 4.

Figure 7:
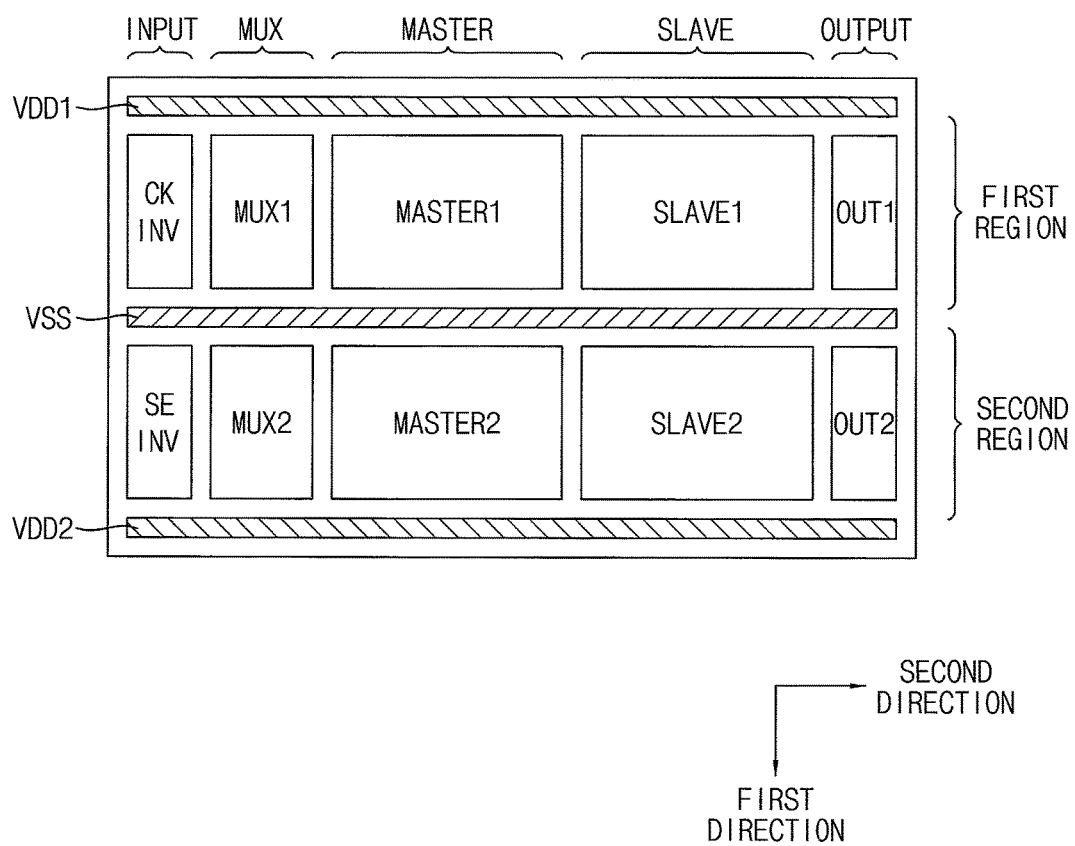
Figure 8:
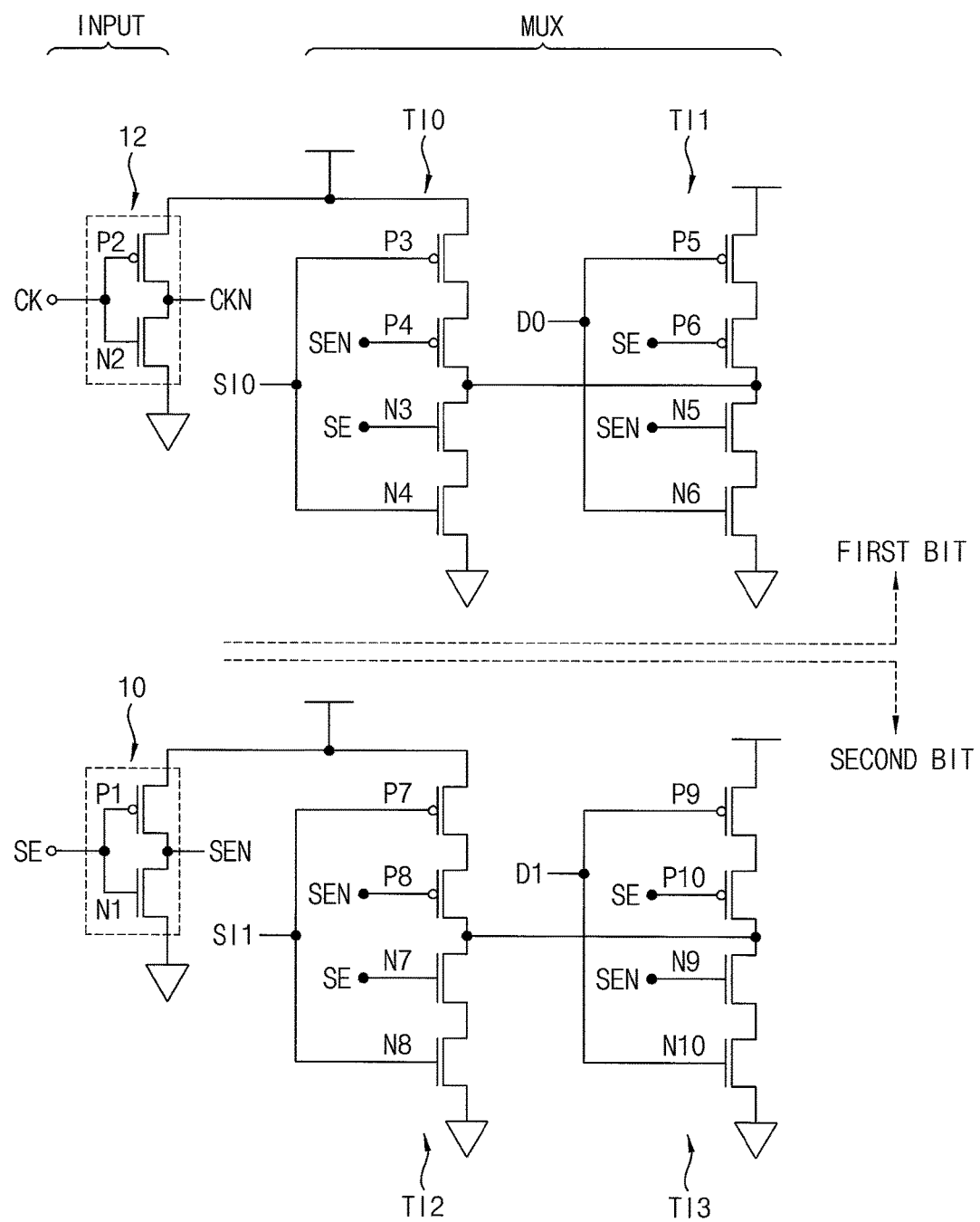
Figure 9:
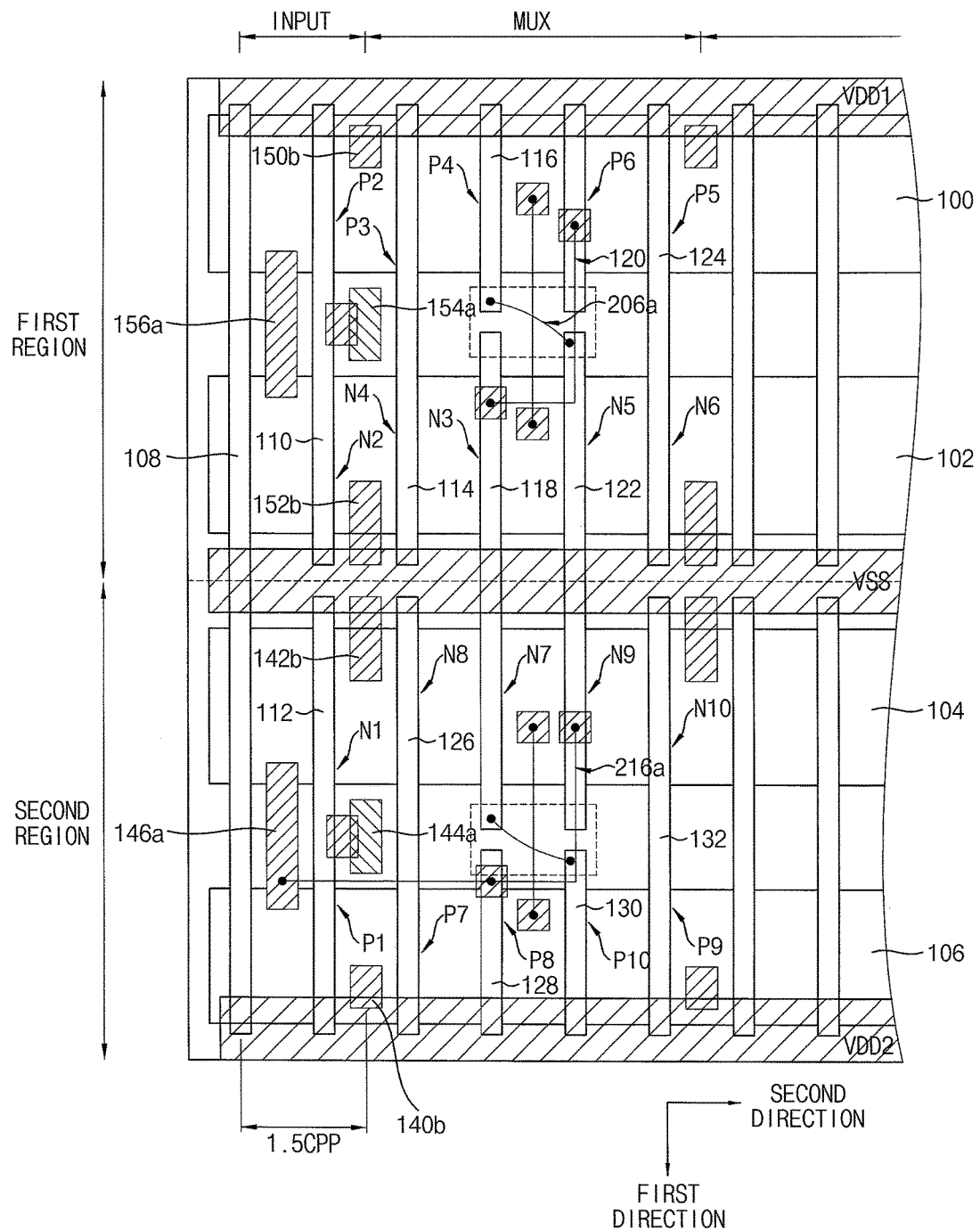

FIG. 7 is an exemplary block diagram illustrating an arrangement of parts of the multi-bit flip-flop circuit in FIG. 1. FIG. 8 is an equivalent circuit diagram illustrating an input part and a multiplex part of the multi-bit flip-flop circuit according to the arrangement of FIG. 7. FIG. 9 is an exemplary layout illustrating a portion of the multi-bit flip-flop circuit according to the arrangement of FIG. 7.

Referring to FIGS. 7 and 8, the flip-flop circuit may be formed in the first and second regions of a substrate. The flip-flop circuit may include an input part INPUT, a multiplex part MUX, a master part MASTER, a slave part SLAVE and an output part OUTPUT in first and second regions, which may be arranged in this order from left to right in the second direction, as illustrated with reference to FIG. 3. However, positions of a CK inverter and a SE inverter may be different from the positions of the CK inverter and the SE inverter of the flip-flop circuit of FIG. 3. Particularly, the CK inverter may be formed in the first region, and the SE inverter may be formed in the second region.

Referring to FIGS. 7, 8 and 9, a first tri-state buffer TI0 of the first multiplex part may be formed adjacent to the CK inverter 12. A third tri-state buffer TI2 of the second multiplex part may be formed adjacent to the SE inverter 10.

Thus, an impurity region and a wiring of the first tri-state buffer to which the power supply voltage may be applied may also serve as the second P source region of the CK inverter 12 and the fifth wiring 150b, respectively. An impurity region and a wiring of the third tri-state buffer to which the power supply voltage may be applied may also serve as the first P source region of the SE inverter 14 and the first wiring 140b, respectively.

In example embodiments, first to fourth active regions 100, 102, 104 and 106 of the substrate may be substantially the same as the first to fourth active regions 100, 102, 104 and 106 illustrated with reference to FIG. 4. Also, first to twelfth gates 110, 112, 114, 116, 118, 120, 122, 124, 126, 128, 130 and 132 may be substantially the same as the first to twelfth gates 110, 112, 114, 116, 118, 120, 122, 124, 126, 128, 130 and 132 illustrated with reference to FIG. 4.

The CK inverter 12 and the SE inverter 10 may be aligned in the first direction. Thus, each of the SE inverter 10 and the CK inverter 12 may be formed within an area of equal to or less than about 1.5 CPP in the second direction.

In example embodiments, P1 and N1 of the SE inverter 10 may be formed on the third and fourth active regions 104 and 106. P2 and N2 of the CK inverter may be formed on the first and second active regions 100 and 102. The transistors included in the multiplex part MUX may be substantially the same as the transistors included in the multiplex part MUX illustrated with reference to FIG. 4.

A wiring 216a through which an outputting signal of the SE inverter in the second region may be transferred to the seventh gate of N9 and the tenth gate 128 of P8 may be formed. A wiring 206a through which the outputting signal of the SE inverter in the second region may be transferred to the seventh gate 122 of N5 and the fourth gate 116 of P4 may be formed. In this case, N9 and N5 may share the seventh gate 122, and the outputting signal of the SE inverter may be inputted to the fourth gate 116 of P4 via the seventh gate 122.

Figure 10:
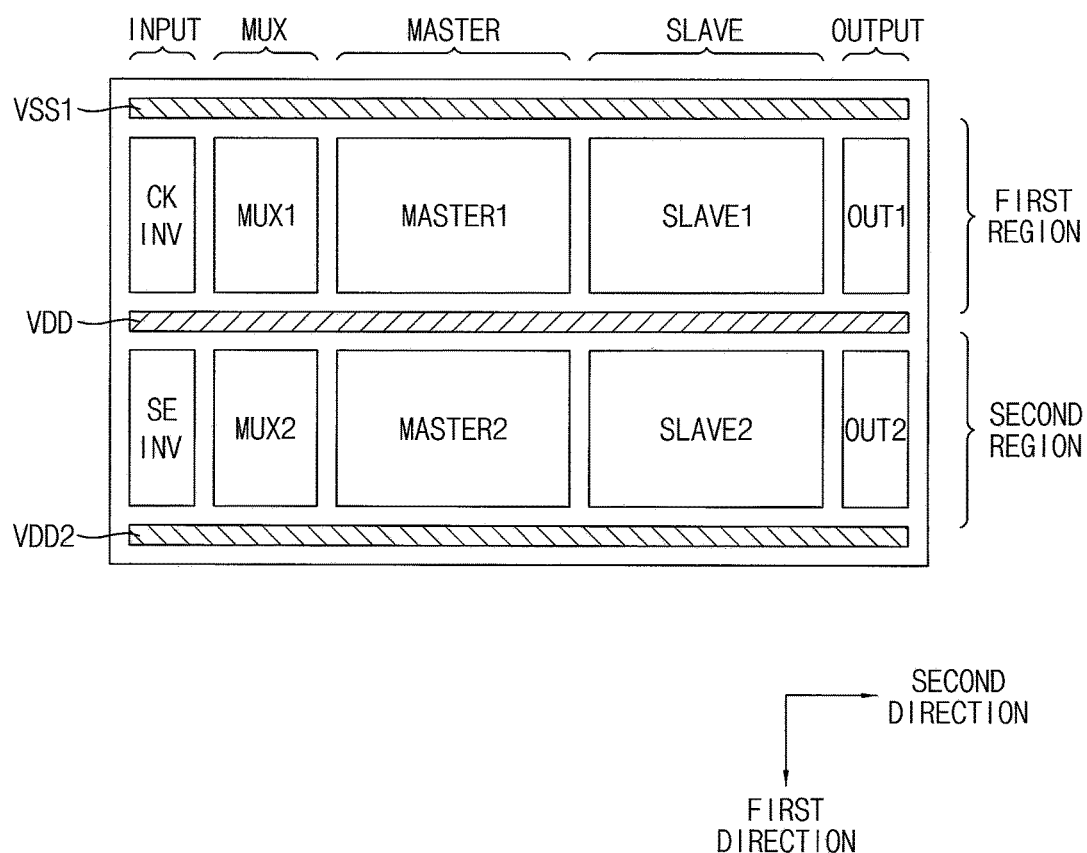
Figure 11:
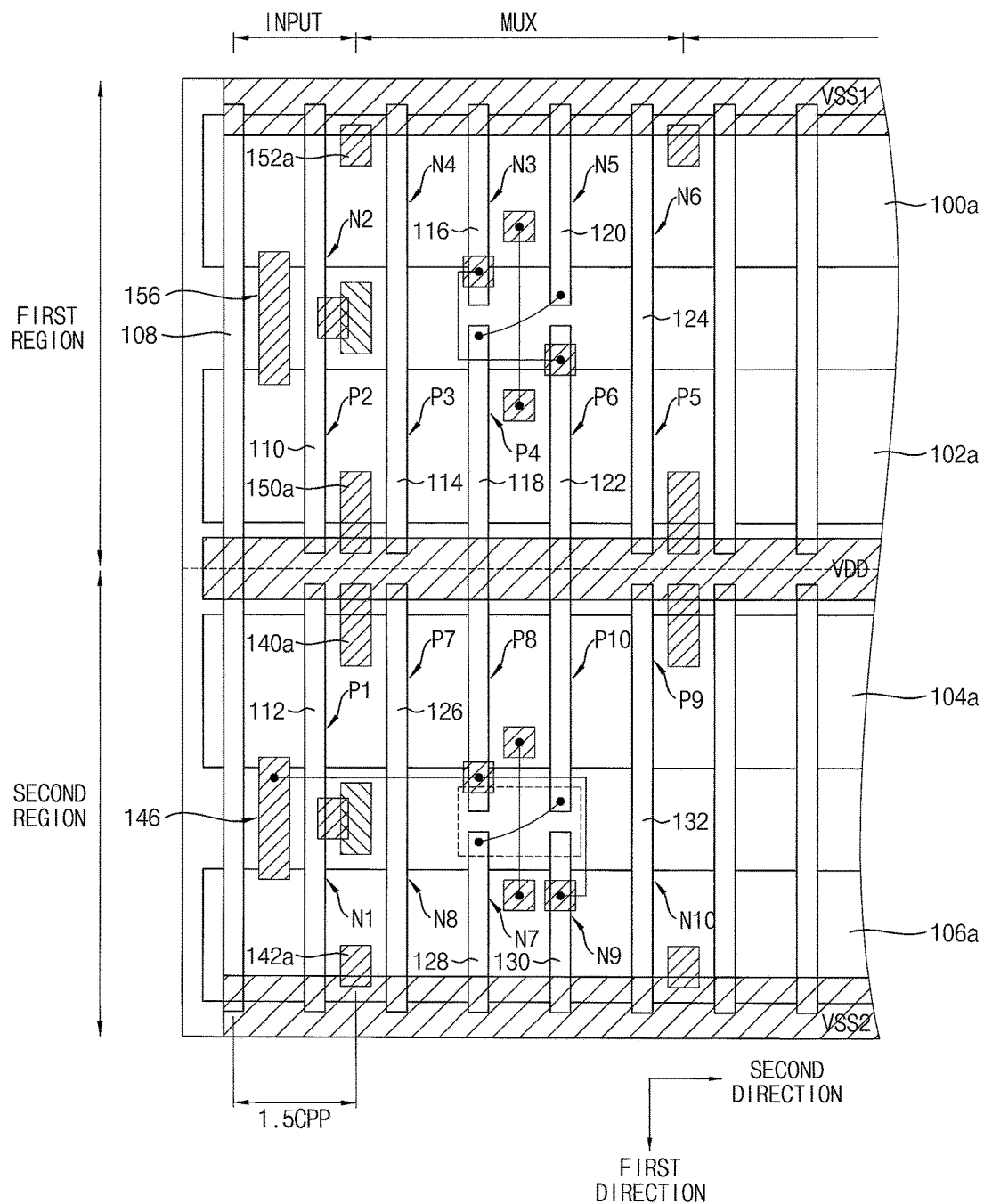

FIG. 10 is an exemplary block diagram illustrating an arrangement of parts of the multi-bit flip-flop circuit in FIGS. 1 and 8. FIG. 11 is an exemplary layout illustrating a portion of the multi-bit flip-flop circuit according to the arrangement of FIG. 10;

In FIGS. 8 and 11, same reference numerals may be given to same elements of corresponding transistors.

Referring to FIGS. 10 and 11, the flip-flop circuit may be formed in the first and second regions of a substrate. The flip-flop circuit may include an input part INPUT, a multiplex part MUX, a master part MASTER, a slave part SLAVE and an output part OUTPUT in first and second regions, which may be arranged in this order from left to right in the second direction, as illustrated with reference to FIG. 7. However, positions of a VDD line and ground lines may be different from the positions of the VDD lines and the ground line of the flip-flop circuit of FIG. 7.

Particularly, the first region may include a first active region 100a and a second active region 102a, and the second region may include a third active region 104a and a fourth active region 106a.

In example embodiments, the first ground line VSS1 may be formed at an upper portion of the first region. The first ground line VSS1 may be formed adjacent to an upper portion in the first direction of the first active region 100a.

In example embodiments, a VDD line for supplying a power supply voltage may be formed between the first and second regions. The VDD line may be formed between the second and third active regions 102a and 104a. The power supply voltage may be supplied to the first circuit formed in the first region and a second circuit formed in the second region via the VDD line.

In example embodiments, a second ground line VSS2 may be formed at a lower portion of the second region. The second ground line may be formed adjacent to a lower portion in the first direction of the fourth active region 106a. The second circuit formed in the second region may be connected to a ground level via the second ground line VSS2.

According to positions of the ground lines VSS1 and VSS2 and the VDD line, positions of the NMOS transistors and the PMOS transistors included in the first and second circuits may be changed. That is, the PMOS transistors may be formed adjacent to the VDD line, and the NMOS transistors may be formed adjacent to the first ground line VSS1 or the second ground line VSS2.

Referring to FIG. 11, the NMOS transistors may be formed on the first and fourth active regions 100a and 106a. The PMOS transistors may be formed on the second and third active regions 102a and 104a. Thus, in the first and fourth active regions 100a and 106a, a channel region of a transistor may be doped with p-type impurities, and source/drain regions of the transistor may be doped with n-type impurities. In the second and third active regions 102a and 104a, a channel region of a transistor may be doped with n-type impurities, and source/drain regions of the transistor may be doped with p-type impurities.

In example embodiments, first to twelfth gates 110, 112, 114, 116, 118, 120, 122, 124, 126, 128, 130 and 132 included in the input part INPUT and the multiplex part MUX may be substantially the same as the first to twelfth gates 110, 112, 114, 116, 118, 120, 122, 124, 126, 128, 130 and 132 illustrated with reference to FIG. 9. However, the conductivities of the transistors on the active regions may be reversed, and thus an arrangement of wirings may be changed. That is, the transistors may be electrically connected to each other by the wiring so that the circuits shown in FIG. 8 may be formed.

The SE inverter and the CK inverter may be formed in the input part INPUT, and may be aligned in the first direction. Thus, each of the SE inverter and the CK inverter may be formed within an area of equal to or less than about 1.5 CPP in the second direction.

In example embodiments, P2 of the CK inverter may be formed on the second active region 102a. A second P source region of P2 and a fifth wiring 150a may be electrically connected to the VDD line. An impurity region and a wiring of the first tri-state buffer to which the power supply voltage may be applied may also serve as the second P source region of the CK inverter and the fifth wiring 150a, respectively.

In example embodiments, P1 of the SE inverter may be formed on the third active region 104a. A first P source region of P1 and a first wiring 140a may be electrically connected to the VDD line. An impurity region and a wiring of the third tri-state buffer to which the power supply voltage may be applied may also serve as the first P source region of the SE inverter and the first wiring 140a, respectively.

In example embodiments, the unit flip-flop circuit may be designed to process three or more bits.

In the unit flip-flop circuit for processing multi-bits, the SE inverter and the CK inverter may be aligned in the first direction. Thus, each of the SE inverter and the CK inverter may be formed within an area of equal to or less than about 1.5 CPP in the second direction. Impurity regions and wirings of the CK inverter and the SE inverter to which the power supply voltage may be applied may also serve as impurity regions and wirings of the multiplex part MUX, respectively, to which the power supply voltage may be applied.

Figure 12:
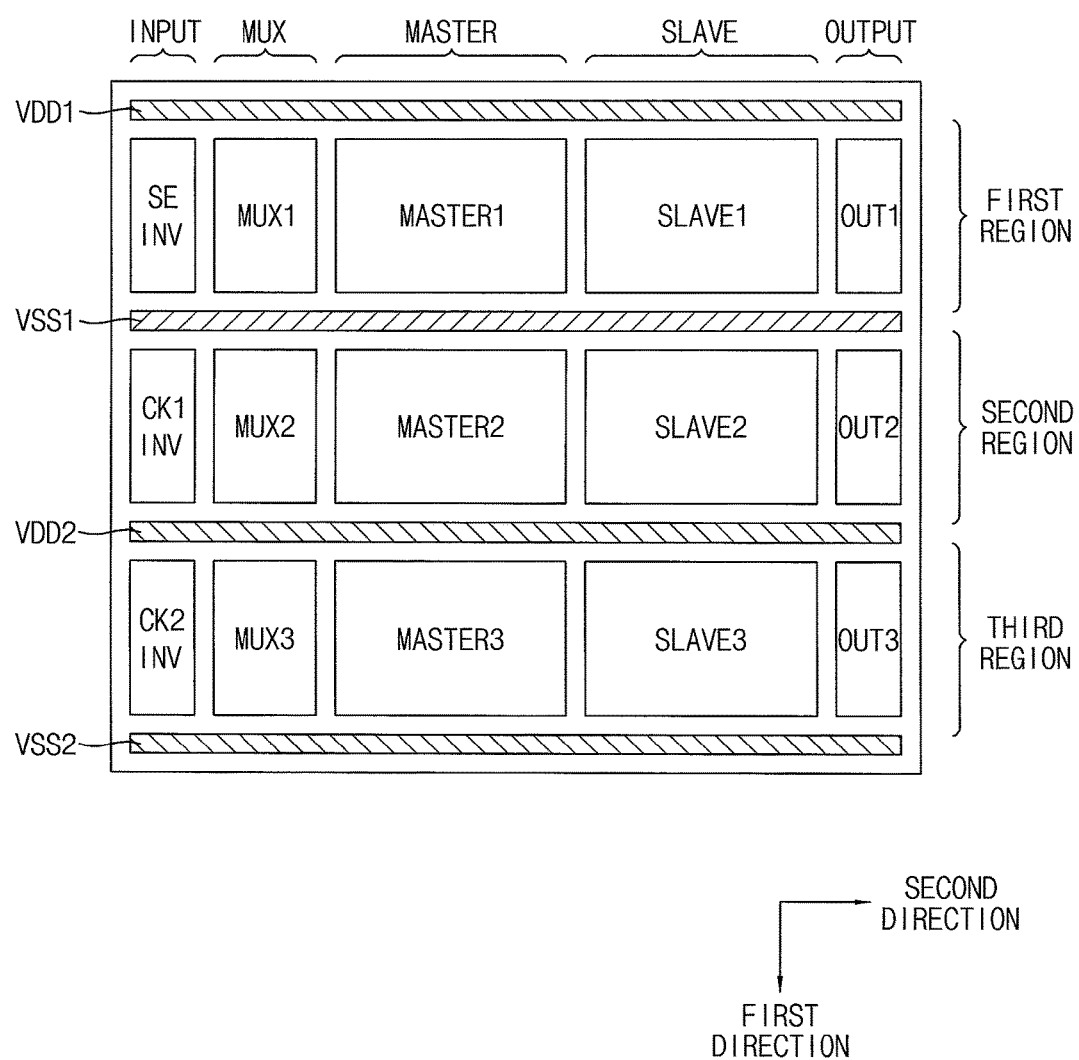

FIG. 12 is an exemplary block diagram illustrating a triple-bit flip-flop circuit.

Referring to FIG. 12, three inverters may be formed in an input part INPUT of a unit flip-flop circuit. Thus, one SE inverter, one CK inverter and an additional inverter may be formed in the input part INPUT. One of the SE inverter and the CK inverter may be further formed.

In example embodiments, one SE inverter and two CK inverters may be formed in the input part INPUT. As shown in FIG. 12, for example, the SE inverter may be formed on a first region, a first CK inverter and a second CK inverter may be formed on second and third regions, respectively. An arrangement of the inverters may not be limited thereto, and an arrangement of the SE inverter and the first and second CK inverters may be changed in the input part INPUT.

Figure 13:
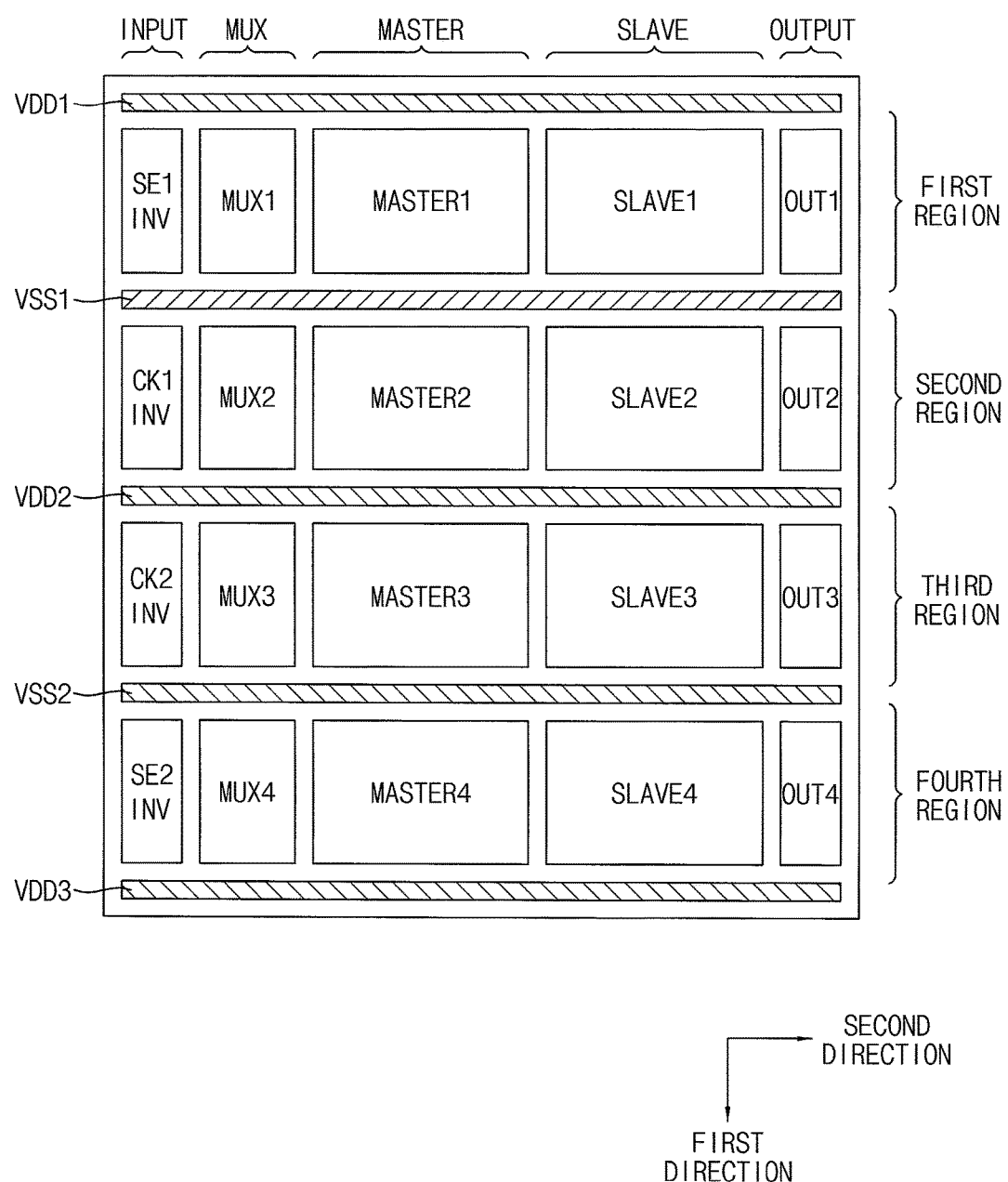

FIG. 13 is an exemplary block diagram illustrating a quadruple-bit flip-flop circuit.

Referring to FIG. 13, four inverters may be formed in an input part INPUT of a unit flip-flop circuit. Thus, one SE inverter, one CK inverter and two additional inverters may be formed in the input part INPUT. Two of the SE inverter and the CK inverter may be further formed.

In example embodiments, two SE inverters and two CK inverters may be formed in the input part INPUT. As shown in FIG. 13, for example, a first SE inverter, a first CK inverter, a second SE inverter and a second CK inverter may be sequentially formed in first to fourth regions, respectively. An arrangement of the inverters may not be limited thereto, and an arrangement of the first and second SE inverters and the first and second CK inverters may be changed in the input part INPUT.

In example embodiments, three SE inverters and one CK inverters may be formed in the input part INPUT. However, the arrangement of the inverters may not be limited thereto.

In example embodiments, one SE inverter and three CK inverters may be formed in the input part. However, the arrangement of the inverters may not be limited thereto.

In the above semiconductor integrated circuit, the SE inverter and the CK inverter may be aligned in the first direction. Thus, the semiconductor integrated circuit may have a high degree of integration, and may be used in a mobile device.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

What is claimed is:

1. A semiconductor integrated circuit comprising:
   a scan enable (SE) inverter and a clock (CK) inverter on a substrate, the SE inverter and the CK inverter being aligned in a first direction to each other, wherein a first gate of the SE inverter and a second gate of the CK inverter are disposed on one imaginary line extending in the first direction;
   a first multiplex part including a first wiring and a first transistor, the first wiring being connected to a power supply voltage part of the SE inverter, and the first wiring and the first transistor sharing a source region contacting the first wiring; and
   a second multiplex part including a second wiring and a second transistor, the second wiring being connected to a power supply voltage part of the CK inverter, and the second wiring and the second transistor sharing a source region contacting the second wiring, wherein:
   the power supply voltage parts of the SE inverter and the CK inverter include a first VDD line and a second VDD line, respectively, each of the first and second VDD lines extending in a second direction substantially perpendicular to the first direction, and
   the first wiring is connected with the first VDD line, and the second wiring is connected with the second VDD line.

2. The semiconductor integrated circuit of claim 1, wherein the CK inverter is disposed under the SE inverter in the first direction.

3. The semiconductor integrated circuit of claim 1, wherein the CK inverter is disposed over the SE inverter in the first direction.

4. The semiconductor integrated circuit of claim 1, further comprising a ground line extending in the second direction, wherein the SE inverter and the CK inverter are connected with the ground line.

5. The semiconductor integrated circuit of claim 1, the power supply voltage parts of the SE inverter and the CK inverter include a VDD line extending in a second direction, wherein the first and second wirings are connected with the VDD line.

6. The semiconductor integrated circuit of claim 5, further comprising:
   a first ground line and a second ground line each extending in the second direction, wherein the SE inverter is connected with the first ground line, and the CK inverter is connected with the second ground line.

7. The semiconductor integrated circuit of claim 1, wherein the CK inverter and the SE inverter are formed in areas of the substrate, the areas having substantially the same size.

8. The semiconductor integrated circuit of claim 1, wherein a first gate of the SE inverter and a second gate of the CK inverter are aligned in the first direction.

9. The semiconductor integrated circuit of claim 1, further comprising:
a first master part, a first slave part and a first output part disposed adjacent to the first multiplex part in this order in a second direction; and
a second master part, a second slave part and a second output part disposed adjacent to the second multiplex part in this order in the second direction.

10. The semiconductor integrated circuit of claim 9, wherein the first master part, the first slave part and the first output part are aligned in the first direction to the second master part, the second slave part and the second output part, respectively.

11. A semiconductor integrated circuit comprising:
a substrate including a first region for processing a first bit and a second region for processing a second bit, the second region being under the first region in a first direction;
a scan enable (SE) inverter and a clock (CK) inverter on the substrate, the SE inverter and the CK inverter being aligned to each other in the first direction;
a first multiplex part adjacent to the SE inverter in a second direction substantially perpendicular to the first direction, the first multiplex part including a first wiring and a first transistor, the first wiring being connected to a power supply voltage of the SE inverter, and the first wiring and the first transistor sharing an impurity region contacting the first wiring; and
a second multiplex part including a second wiring and a second transistor, the second wiring being connected to a power supply voltage of the CK inverter, and the second wiring and the second transistor sharing an impurity region contacting the second wiring.

12. The semiconductor integrated circuit of claim 11, further comprising:
a first VDD line, a second VDD line and a ground line each extending in the second direction, wherein
the first VDD line is formed at an upper portion of the first region, the second VDD line is formed at a lower portion of the second region, and the ground line is formed between the first and second regions.

13. The semiconductor integrated circuit of claim 12, wherein:
the first wiring is connected to one of the first VDD line and the second VDD line adjacent to the first wiring, and
the second wiring is connected to another one of the first VDD line and the second VDD line.

14. The semiconductor integrated circuit of claim 11, wherein:
the SE inverter includes a first gate extending in the first direction on first and second active regions, the first and second active regions being substantially parallel with each other, and
the CK inverter includes a second gate extending in the first direction on third and fourth active regions, the third and fourth active regions being substantially parallel with each other.

15. A flip-flop comprising:
a first inverter comprising a first PMOS transistor and a first NMOS transistor;
a second inverter comprising a second PMOS transistor and a second NMOS transistor;
a first tri-state buffer comprising third and fourth PMOS transistors and third and fourth NMOS transistors;
a first active region in which the first, third, and fourth PMOS transistors are formed; and
a second active region in which the first, third, and fourth NMOS transistors are formed, wherein:
a first portion of the first active region operates as a source for each of the first and third PMOS transistors,
a first portion of the second active region operates as a source for each of the first and fourth NMOS transistors,
a second portion of the first active region operates as a drain for the third PMOS transistor and a source for the fourth PMOS transistor,
a second portion of the second active region operates as a drain for the fourth NMOS transistor and a source for the third NMOS transistor,
a first gate extends longitudinally in a first direction so as to overlap the first and second active regions and constitutes a gate for each of the first PMOS transistor and the first NMOS transistor,
a second gate: (1) extends longitudinally in the first direction so as to overlap a third active region in which the second PMOS transistor is formed and a fourth active region in which the second NMOS transistor is formed and (2) constitutes a gate for each of the second PMOS transistor and the second NMOS transistor, and
the first and second gates are aligned along the first direction.

16. The flip-flop of claim 15, wherein a third gate overlaps the first and second active regions and constitutes a gate for each of the third PMOS transistor and the fourth NMOS transistor.

17. The flip-flop of claim 16, wherein the first PMOS transistor and the first NMOS transistor are aligned and the third PMOS transistor and the fourth NMOS transistor are aligned in parallel with the alignment of the first PMOS transistor and the first NMOS transistor.

18. The flip-flop of claim 17, wherein the first and second gates are separated by one gate pitch.

* * * * *